(12) United States Patent
Robotti et al.

(10) Patent No.: US 6,375,901 B1
(45) Date of Patent: Apr. 23, 2002

(54) CHEMICO-MECHANICAL MICROVALVE AND DEVICES COMPRISING THE SAME

(75) Inventors: Karla M. Robotti, Mt. View; Sally A. Swedberg, Palo Alto; Hongfeng Yin, San Jose, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/294,867

(22) Filed: Apr. 20, 1999

Related U.S. Application Data (60) Provisional application No. 60/091,093, filed on Jun. 29, 1998.

(51) Int. Cl.[7] .................. B01L 11/00; G01N 1/10; F15B 21/00
(52) U.S. Cl. .................. 422/103; 137/807; 436/180
(58) Field of Search .................. 422/100, 103; 137/828, 807

(56) References Cited

U.S. PATENT DOCUMENTS

| | | | | |
|---|---|---|---|---|
| 4,676,274 A | * | 6/1987 | Brown | 137/806 |
| 4,949,742 A | * | 8/1990 | Rando et al. | 137/13 |
| 5,311,896 A | * | 5/1994 | Kaartinen | 137/15 |
| 5,354,538 A | * | 10/1994 | Bunce et al. | 422/100 |
| 5,480,614 A | | 1/1996 | Kamahori | 422/70 |
| 5,543,838 A | | 8/1996 | Hosier et al. | 348/311 |
| 5,571,410 A | | 11/1996 | Swedberg et al. | 210/198.2 |
| 5,605,662 A | | 2/1997 | Heller et al. | 422/68.1 |
| 5,645,702 A | | 7/1997 | Witt et al. | 204/501 |
| 5,653,859 A | | 8/1997 | Parton et al. | 204/450 |
| 5,653,939 A | | 8/1997 | Hollis et al. | 422/50 |
| 5,658,413 A | | 8/1997 | Kaltenbach et al. | 156/272.8 |
| 5,681,751 A | | 10/1997 | Begg et al. | 436/89 |
| 5,746,901 A | | 5/1998 | Balch et al. | 204/606 |
| 5,755,942 A | | 5/1998 | Zanzucchi et al. | 204/454 |
| 5,770,029 A | | 6/1998 | Nelson et al. | 204/604 |
| 5,885,475 A | * | 3/1999 | Salyer | 252/70 |
| 5,929,214 A | | 7/1999 | Peters et al. | 530/417 |
| 5,944,754 A | * | 8/1999 | Vacanti | 623/11 |
| 5,958,344 A | * | 9/1999 | Levine | 422/103 |
| 5,988,197 A | * | 11/1999 | Colin et al. | 137/13 |
| 6,048,734 A | * | 4/2000 | Burns et al. | 436/180 |
| 6,171,610 B1 | * | 1/2001 | Vacanti et al. | 424/426 |

* cited by examiner

*Primary Examiner*—Robert J. Warden, Sr.
*Assistant Examiner*—Brian R Gordon (57) ABSTRACT

Micro-fluid devices and methods for their use are provided. The subject devices are characterized by the presence of at least one micro-valve comprising a phase reversible material, e.g. a reversible gel, that reversibly changes its physical state in response to an applied stimulus, e.g. a thermoreversible gel. In using the subject device, fluid flow along a flow path of the device is modulated by applying an appropriate stimulus, e.g. changing the temperature, to the microvalve. The subject devices find use in a variety of applications, including micro-analytical applications.

32 Claims, 4 Drawing Sheets

CHEMICO-MECHANICAL MICROVALVE AND DEVICES COMPRISING THE SAME

CROSS-REFERENCE TO RELATED APPLICATIONS

Pursuant to 35 U.S.C. §119 (e), this application claims priority to the filing date of the U.S. Provisional Patent Application Serial No. 60/091,093 filed Jun. 29, 1998, the disclosure of which is herein incorporated by reference.

INTRODUCTION

1. Technical Field

The field of this invention is micro-fluidic devices.

2. Background of the Invention

Many important chemical processes are carried out in fluid environments, where such processes include chemical syntheses, fluid sample analyses, fluid component separations, and the like. In many situations, it is desirable to work with small volumes of fluid, e.g. from femtoliter to $\mu l$ quantities of fluid. Such situations include sample analysis in which small volumes of initial sample are analyzed; chemical synthesis, in which small quantities of chemical are desired and/or expensive reagents are employed, and the like. As such, there has been much interest in the development of micro-fluidic devices in which fluid is manipulated through one or more micro-channels present in the device.

A variety of different micro-fluidic devices have been developed in recent years. Such devices hold the promise of providing significant advantages over conventional macro-scale fluid manipulation devices. Such advantages include: ease of use, such that minimally trained technicians can operate the device; portability, such that fluid analyses can be conducted in the field as opposed to in the lab; reduced sample size requirements; reduction in solvent waste generation; and the like.

Despite the potential advantages provided by such devices, there are still significant technical obstacles that must be overcome if such devices are ever to realize their full potential. One such obstacle is the control of fluid flow, particularly between various regions or compartments in the device, i.e. control of fluid flow at the micro/micro interface level.

A number of purely mechanical approaches have been proposed in order to control the micro/micro interface in such devices. Purely mechanical means, e.g. valves, that have been proposed to control fluid flow in micro-fluidic devices include: flexible membranes, needle valves and the like. However, there are significant drawbacks associated with each of these proposals, which drawbacks include: inability to control the valve, lack of sufficiently strong materials, lack of ability to sufficiently seal the valve, etc.

As such, there is continued interest in the identification of a valve means for controlling fluid flow within a micro-fluidic device.

Relevant Literature

Micro-fluidic devices are described in U.S. Pat. Nos.: 5,770,029; 5,755,942; 5,746,901; 5,681,751; 5,658,413; 5,653,939; 5,653,859; 5,645,702;5, 605,662; 5,571,410; 5,543,838; 5,480,614, the disclosures of which are herein incorporated by reference.

Reversible gel compositions are described in U.S. Pat. Nos.: 5,720,717; 5,672,656; 5,631,337; 5,569,364; 5,670,480; 5,658,981; 5,470,445; 5,432,245; 5,298,260; 5,162,582; 4,439,966, the disclosures of which are herein incorporated by reference.

SUMMARY OF THE INVENTION

Micro-fluidic devices and methods for their use are provided. The subject devices are characterized by having at least one micro-valve that modulates fluid flow through the device. The micro-valve comprises a phase reversible material, e.g. gel, that is capable of reversibly changing its physical state in response to an applied stimulus. In using the subject devices, fluid flow is controlled by applying the appropriate stimulus to the micro-valve. The subject devices find use in a variety of different applications, particularly micro-fluidic analytical applications.

DESCRIPTION OF THE SPECIFIC EMBODIMENTS

Micro-fluidic devices and methods for their use are provided. Fluid flow through the micro-fluidic devices is modulated by at least one micro-valve comprising a phase reversible material, e.g. gel, that is capable of reversibly changing physical states in response to an applied stimulus. The subject devices find use in a variety of applications, particularly in micro-analytical applications of fluid samples.

Before the subject invention is described further, it is to be understood that the invention is not limited to the particular embodiments of the invention described below, as variations of the particular embodiments may be made and still fall within the scope of the appended claims. It is also to be understood that the terminology employed is for the purpose of describing particular embodiments, and is not intended to be limiting. Instead, the scope of the present invention will be established by the appended claims.

In this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

The subject invention provides a novel chemico-mechanical means for modulating fluid flow through a micro-fluidic device, i.e. a chemico-mechanical micro-valve. The micro-valves of the subject invention find use in a variety of different micro-fluidic devices. As used herein, the term "micro-fluidic" device refers to any device in which micro-volumes of fluid are manipulated along a fluid flow path during any given use or operation, e.g. sample preparation, sample separation, chemical synthesis, etc., where "micro-volume" means from about 10 femtoliters to 500 $\mu l$, usually from about 100 femtoliters to about 200 $\mu l$.

The micro-fluidic devices contain at least one fluid flow path through which fluid flows through the device, where a plurality of flow paths that may or may not be intersecting and may be positioned in any convenient configuration may be present in the device, as described in greater detail infra. Generally, the micro-fluidic devices in which the subject valves find use will have at least one micro-compartment positioned at some point in the fluid flow path, where the term "micro-compartment" means any type of structure in which micro-volumes of fluid may be contained, and includes micro-chambers, micro-channels, micro-conduits and the like. Depending on the nature of the micro-compartment, the micro-compartment may be the entire fluid flow path through the device, e.g. where the fluid flow path is a micro-channel, as described infra, or occupy only a portion of the fluid flow path of the device. The term micro-chamber, as used herein, means any structure or compartment having a volume ranging from about 1 $\mu$l to 500 $\mu$l, having cross-sectional areas ranging from about 0.05 $cm^2$ with a chamber depth of 200 $\mu$m to 5 $cm^2$ with a chamber depth of 1 mm; usually from about 10 $\mu$l to 500 $\mu$l, having a cross-sectional area ranging from about 0.5 $cm^2$ with a chamber depth of 200 $\mu$m to about 5 $cm^2$ with a chamber depth of 1 mm; and more usually from about 20 $\mu$l to 200 $\mu$l, having a cross-sectional area ranging from about 1 $cm^2$ with a chamber depth of 200 $\mu$m to about 4 $cm^2$ with a chamber depth of 500 $\mu$m. The micro-compartment structure may have any convenient configuration, including square, circular, rectangular, octagonal, irregular etc. Micro-channels or micro-conduits are micro-compartments that are dimensioned such that fluid is capable of flowing through the micro-channel by capillary flow, i.e. the micro-channel is of capillary dimensions. By capillary dimensions is meant a structure or container in which any cross-sectional dimension from one side to another, e.g. diameter, widest point between two walls of a channel, etc., does not exceed about 250 $\mu$m. Generally, any cross-sectional dimension of the micro-channel will range from about 10 to 250 $\mu$m, usually from about 50 to 200 $\mu$m.

The micro-channel(s) of the device may have a linear configuration, a curved configuration, or any other configuration, e.g. spiral, angular, etc., depending on the intended use of the device. In addition, there may be more than one micro-channel in the device, where the micro-channels may: (a) intersect at various points to form complicated flow paths or patterns through the device, e.g. Y-shaped intersections, T-shaped intersections, crosses; and (b) be separated by one or more micro-chambers, etc, depending on the intended use of the device.

In many embodiments, the micro-channel(s) of the device, as well as any other components, e.g. entry ports, etc., will be present in an essentially planar-shaped substrate, e.g. a card-shaped substrate, disk-shaped substrate, etc. The substrate may be fabricated from a variety of different materials, including polymeric substrates, such as polyimides, polycarbonates, polyesters, polyamides, polyethers, polyolefins, and mixtures thereof, as well as silicon or silicon dioxide based materials, such as quartz, fused silica, glass (borosilicates) etc, ceramics and composites thereof.

A variety of different micro-fluidic devices have been developed in which the subject micro-valve may find use, where such devices include those described in U.S. Pat. Nos. 5,770,029; 5,755,942; 5,746,901; 5,681,751; 5,662,787; 5,661,028; 5,658,413; 5,653,939; 5,653,859; 5,645,702; 5,632,876; 5,605,662; 5,599,432; 5,585,069; 5,571,410; 5,543,838; 5,540,826; 5,480,614; 5,458,761 the disclosures of which are herein incorporated by reference. Of particular interest in many embodiments are the $\mu$-TAS devices described in U.S. Pat. Nos. 5,658,413; 5,571,410 and 5,500,071, the disclosures of which are herein incorporated by reference.

The micro-fluidic devices of the subject invention are characterized by having at least one micro-valve that modulates the flow of fluid along at least one fluid flow path in the device. As the micro-valve modulates the flow fluid through one or more of the fluid flow paths in the device (if the device comprises more than one fluid flow path), the micro-valve also modulates fluid flow through micro-compartments present in the device. By "modulates" is meant that the micro-valve is capable of at least restricting or enhancing fluid flow along the flow path, where the micro-valve may be: (a) a proportional micro-valve, in that it can restrict fluid flow in response to an appropriate stimulus but not completely inhibit fluid flow; or (b) an on/off micro-valve, in that it can completely inhibit fluid flow (i.e. close) in response to an appropriate stimulus.

The micro-valve of the subject devices is characterized by comprising a phase reversible material which modulates fluid flow along a flow path in the device. By phase reversible material is meant a material that changes its physical state, e.g. going from a soluble state to a solid state, in response to an applied stimulus. The phase reversible material is a material that is capable of going from a first stage that is substantially permeable to fluid, i.e. allows free flow of fluid, to a second stage that is substantially impermeable to fluid, i.e. substantially inhibits fluid flow. Any phase reversible material may be employed, so long as the material changes in phase in response to an applied stimulus in a manner sufficient to modulate its fluid permeability, i.e. the ability of fluid to flow through the material.

As such, the phase reversible material is a material that responds to an applied stimulus with a phase change. The material may be responsive to a number of distinct stimuli, where stimuli of interest include: temperature, pH, electrical current, light, magnetic field, etc. Specific materials of interest are polymers.

In many embodiments, the phase reversible material is a reversible gel, where by reversible gel is meant a gel composition that is capable of changing its physical state, e.g. from soluble to semi-solid gel state, in response to a particular stimulus, e.g. termpertature, pH, chemical agent, electrical current, light, etc. Such gel compositions are known in the art as "smart" gels, "intelligent" gels, hydrogels, etc. The subject micro-valves of this embodiment in which the phase reversible material is a gel composition may comprise any suitable phase reversible gel, as long as the gel is capable of changing its physical state in response to an applied stimulus.

Of particular interest in many embodiments of the subject invention are reversible gels that change their physical state, e.g. change their fluid permeability by going from a first state to a second state, such as soluble to semi-solid, in response to a change in temperature, i.e. thermoreversible or temperature sensitive gels. The thermoreversible or temperature sensitive gels that find use in the microvalves of the subject invention are those gels that are capable of changing their physical state, e.g. gels that go from a soluble state to a semi-solid state, over a narrow temperature range, e.g. the lower critical solution temperature (LCST). In the thermoreversible gels finding use as a phase reversible material in the micro-valves of the subject invention, both gels which go from a solid to a soluble form as well as gels that go from a soluble to a solid form as the temperature increases find use, where in many embodiments, those thermoreversible gels which go from a soluble form to a solid form as the temperature increases of are particular interest.

A variety of thermoreversible or temperature sensitive gels have been identified and are suitable for use in the micro-valves of the subject invention. Thermoreversible polymeric gels of interest include those comprising polymers such as: partially saponified polyvinyl acetates, polyvinyl methyl ether, methyl cellulose, polyalkylene oxides, polyvinyl methyloxazolidinone, and polymacrylamides, and the like, where polyacrylamides and polyalkylene oxide based polymers are of particular interest.

Specific polyacrylamides of interest include: poly-N-ethylacrylamide; poly-N-n-propyl(meth)acrylamides; poly-N-isopropyl(meth)acrylamides; poly-N-cyclopropyl(meth) acrylamides; poly-N,N-diethylacrylamide; poly-N-methyl-N-ethylacrylamide; poly-N-methyl-N-n-propylacrylamide; poly-N-methyl-N-isopropylacrylamide; poly-N-acryloylpiperidine; poly-N-acryloylpyrrolidine; poly-N-tetrahydrofurfuryl(meth)acrylamide; poly-N-methoxypropyl(meth)acrylamide; poly-N-ethoxypropyl (meth)acrylamide; poly-N-isopropoxypropyl(metho) acrylamide; poly-N-ethoxyethyl(meth)acrylamide; poly-N-(2,2-dimethoxyethyl)-N-methylacrylamide; poly-N-1-methyl-2methoxyethyl(meth)acrylamide; poly-N-1-methoxymethylpropyl(meth)acrylamide; poly-N-(1,3-dioxolan-2-yl)-N-methylacrylamide; and poly-N-8-acryloul-1,4-dioxa-8-azaspiro [4,5]decane, N-(2-methoxyethyl)-N-isopropylacrylamide; and the like. Of particular interest in this class of the thermoreversible polymeric compositions are those made up of N-isopropylacrylamide graft copolymers, where polymers of interest include graft copolymers of hydrophobic polymers, e.g. butyl methacrylate; and hydrophilic polymers, e.g. N,N-dimethylacrylamide. See also Takei et al., Bioconjugate Chem. (1993) 4:341–346, which discloses polymers of interest.

Also of particular interest are gels comprising polyalkylene oxides, particularly block copolymers of two or more different polyalkylene oxides, more particularly block copolymers of both hydrophobic and hydrophilic polyalkylene oxides. In many embodiments, block copolymers of polyethylene oxide and polypropylene oxide are preferred, particularly triblock copolymers thereof. Such copolymers are known in the art and sold under the tradenames PLURONIC™ and POLOXAMER™. Specific polyalkylene triblock copolymers of interest include: F-68, F-88; F-98; F-108, F-127 and the like, all available from BASF corporation.

In a first embodiment of the subject invention, the micro-valve is made solely of the phase reversible material. In this embodiment, the phase reversible material may be positioned at one or more distinct locations along the fluid flow path, or along substantially the entire fluid flow path. Where the phase-reversible material occupies substantially the entire fluid flow path, during use its phase is generally switched from a fluid permeable to a fluid impermeable state at one or more distinct locations along the fluid flow path, but not along the entire fluid flow path.

In a preferred structure of this first embodiment, the micro-fluidic device contains at least two intersecting flow paths, one of which is substantially filled by the phase reversible material. In other words, the device includes at least a main flow path and at least one intersecting second flow path, where substantially all of the secondary flow path is occupied by the phase reversible material. By "substantially all" is meant that at least 40%, usually at least 50% and more usually at least 60% of the entire volume of the fluid flow path of the device is occupied by the phase reversible material. In certain embodiments as much as 70%, sometimes as much as 80% of the volume of the fluid flow path is occupied by the phase reversible material. In certain embodiments, up to 100% of the fluid flow path of the device is occupied by the phase reversible material.

The micro-valve that modulates fluid flow along the main flow path is positioned in the intersection of the main flow path and second flow path. The intersection of these flow paths may be minimal, as is found where the main and secondary flows are intersecting straight lines, e.g. as in a cross-shaped intersection (See e.g. FIG. 4), or elongated, as is found in those devices where at least a portion of the secondary flow path is congruent with the main flow path, e.g. where the two halves of the second flow path are not positioned on immediately opposite sides of the main flow path but intersect the main flow path at some distance from each other. See e.g. FIG. 5. In this preferred embodiment, the micro-valve may be the entire length of the intersection of the two flow paths or just a portion thereof.

In these embodiments where the micro-valve consists essentially of the phase reversible material, the phase reversible material will be stably associated with the region of the device in which fluid flow modulation is desired. Stable association may be achieved in a number of ways, including bonding, and the like. In many embodiments, the phase reversible material may be bonded directly to the region of interest of the micro-fluidic device, where the nature of the bond may be covalent or non-covalent. For example, where the phase reversible material is a polymeric gel, the polymeric constituents of the phase reversible material may be bonded directly to the micro-compartment wall of the device in the region in which valve fluid control is desired, where the nature of the bond may be covalent or non-covalent, but will usually be covalent. The length of the micro-compartment occupied by the micro-valve in this second embodiment, i.e. the length of the micro-compartment to which the phase reversible material is stably associated, e.g. to which the polymeric components of the gel have been bound and in which the physical state of the gel is controllable, will vary depending upon the desired characteristics of the micro-valve, i.e. strength, rate of fluid flow modulation, etc., but will generally be at least about 50 $\mu$m, usually at least about 100 $\mu$m and more usually at least about 500 $\mu$m long, and may be as long as 1 cm or longer, but will generally not exceed about 10 cm, and usually will not exceed about 5 cm. In the region of the micro-compartment occupied by the micro-valve, the phase reversible material will generally be stably associated, e.g. bonded, to all surfaces of the compartment in a manner that provides substantially no void space through which fluid may freely flow, e.g. the polymeric constituents of a phase reversible gel will be bonded to all of the surfaces of the micro-compartment, e.g. the top, bottom, left side and right side of a micro-channel having a cross-sectional square shape.

In a second embodiment of the subject invention, the phase reversible material is present in combination with one or more additional mechanical elements, such as a high surface area mechanical means, i.e. the micro-valve is a composite of a phase reversible material and a mechanical element, e.g. a reversible gel in combination with one or more high surface area components, e.g. rods, pins, etc, such as the structures described in U.S. Pat. No. 5,427,663, the disclosure of which is herein incorporated by reference. This embodiment is further characterized by having the high surface area stably associated with one or more walls of the flow path, as described in greater detail infra. The substantial surface area structures may be fabricated from a variety of materials, including quartz, fused silica, polymeric materials, e.g. polyimides, etc. The substantial surface area structures of this embodiment (and therefore the phase reversible material associated therewith) are stably associated with the surface of the micro-compartment in which they are located. Stable association of the structures in the compartment is achieved in a number of ways, such as bonding of the structures to the micro-compartment surface. For example, the micro-valve of the subject invention may comprise a phase reversible material, (e.g. reversible gel) in combination with a plurality of polymeric rods covalently attached to one or more sides of the fluid flow path, e.g. micro-channel, where such a rod configuration is described in Austin et al., Electrophoresis (1996) 17:1075–1079. In such embodiments, the phase reversible material, e.g. the polymeric constituents of the reversible gel, will be attached to the high surface area component, e.g. rod or pin, either non-covalently or covalently, but usually covalently.

In yet another embodiment of the subject devices, the micro-valve comprises a phase reversible material in combination with one more high surface area components, where the phase reversible material/high surface area composite structure is not attached to one or more of the walls of the fluid flow path. Instead, the otherwise mobile or detached composite structure is retained at one or more locations along the fluid flow path with a retaining means, e.g. a mechanical restriction means. Examples of such means include, physical constrictions provided by appropriate configuration of the walls of the flow path, e.g. micro-compartment, in the region in which the phase reversible material is located; stably positioned frits, filters or other solid permeable structures positioned on either side of the phase reversible material in the fluid flow path of the device; and the like. The frits or analogous structural retention means keep the phase reversible material from shifting location in the flow path of the device. The mobile or detached high surface area component of the composite structure in this embodiment may vary widely. Suitable high surface area components of this embodiment include: beads or particles, membranes, mesh structures, and the like.

The micro-valves present in the subject devices are actuated by an actuation means, e.g. a switch, that is external to the device, where the actuation means actuates a phase reversing means that may be entirely external to the device or at least partially internal to the device. As such, the subject device may or may not further comprise one or more internal components of a means for reversing the phase of the phase reversible material in the micro-valve.

The phase changing means which influences the state of a micro-valve in any given device will necessarily depend on the nature of the phase reversible material in the micro-valve, and will be a means capable of applying the requisite stimulus to the material to achieve the desired phase change. Thus, the phase changing means may be a means capable of applying thermal energy, light, electrical current, chemical agents, hydrogen ions, etc., to the phase reversible material. For example, where the micro-valve comprises a thermosensitive gel, the phase changing means will be a means for changing the temperature of the gel in a manner sufficient to change to the phase of the gel from one state to another, e.g. soluble state to semi-solid or solid state. In other words, the phase changing means will be a means capable of taking the gel above and/or below the phase critical temperature or lower critical solution temperature of the gel. An example of such a temperature changing means is a resistance heater. Another example of a suitable temperature changing means is a Peltier device.

As mentioned above, the phase changing means may be completely external to the device, i.e. the phase changing means may be entirely peripheral to the device, or one or more components of, but generally not all of, the phase changing means may be internal to the device. For example, where the phase changing means is an external heating element on which the subject device is placed during operation, the entire phase changing means is external or peripheral to the device. Alternatively, where the phase changing means includes a resistor element integrated into the device which interacts with external circuitry to provide the requisite electrical current to the internal resistor, a portion or component of the phase changing means is internal to the device.

The devices of the subject invention may be fabricated using any convenient methodology. Fabrication of microfluidic devices is known by those of skill in the art and described in a plurality of patent and journal references, including: U.S. Pat. Nos. 5,770,029; 5,755,942; 5,746,901; 5,681,751; 5,662,787; 5,661,028; 5,658,413; 5,653,939; 5,653,859; 5,645,702; 5,632,876; 5,605,662; 5,599,432; 5,585,069; 5,571,410; 5,543,838; 5,500,071; 5,540,826; 5,480,614; 5,458,761 the disclosures of which are herein incorporated by reference. Fabrication of micro-fluidic devices necessarily varies depending on the nature of the device to be fabricated, the materials from which the device is prepared, etc., but may involve one or more of micro-machining, fabrication processes, e.g. laser ablation, photolithography, molding, embossing, and the like.

The preparation of reversible gels, such as thermoreversible gels, which are employed in the subject invention is well known to those of skill in the art and reported in a number of patent and journal references, including: U.S. Pat. Nos. 5,720,717; 5,672,656; 5,631,337; 5,569,364; 5,670,480; 5,658,981; 5,470,445; 5,432,245; 5,298,260; 5,162,582; 4,439,966; the disclosures of which are herein incorporated by reference.

Depending on the nature of the micro-valve, the micro-valve can be placed in the device by a variety of different methodologies. For example, where the micro-valve consists essentially of a reversible gel at the intersection of a secondary and main flow paths, the gel material can be flowed through the secondary flow path which intersects the main flow path at the location in which the micro-valve is desired, where the intersection of the flow paths becomes filled with the reversible gel material and therefore becomes the micro-valve. Where the micro-valve comprises a reversible gel in combination with a high surface area component, e.g. a plurality of rods or pins, the polymeric constituents of the gel may be synthesized directly on the rods or pins, or synthesized separately in solution and then attached to the rods or pins. The high surface area component may be positioned in the micro-compartment prior to placement of the gel, or the composite gel/structure element may be positioned in the micro-compartment following fabrication. The above are merely representative of different protocols that may be used to fabricate the subject devices.

In certain embodiments of the invention, the micro-valve will be fabricated such that it is non-reversible, i.e. it irreversibly opens or closes. Such valves will comprise a material, such as a gel, that is irreversibly capable of changing its physical a state in response to an applied stimulus.

Figure 1:
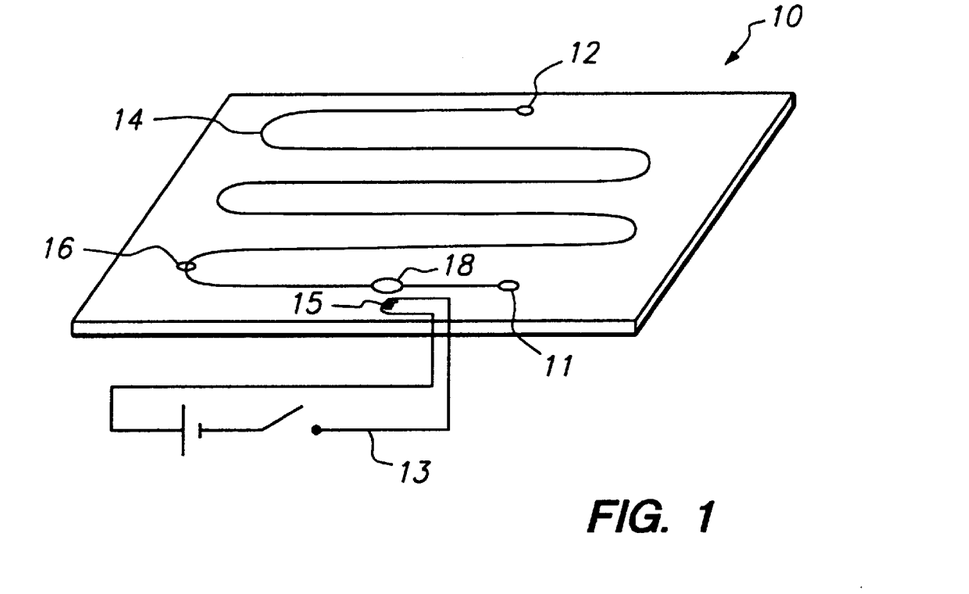
FIG. 1 provides a representation of a micro-fluidic device according to the subject invention.

The subject devices will now be further described in terms of the figures. FIG. 1 depicts a micro-fluidic device according to the subject invention. Microfluidic device 10 comprising a single micro-compartment in the form of a micro-channel 14, having a fluid entry port 12, a fluid exit port 11 and a detecting region 16. Device 10 also has a micro-valve 18 comprising a phase reversible material, e.g. phase reversible gel. The micro-valve region of the flow channel of the device is directly over the resister 15 of heating element 13 (alternatively, the resistor and heating element could be replaced by a Peltier device or other means for raising the temperature of the local region of the flow path). The phase reversible material may be positioned solely in region 18 or in other areas of the micro-channel, including along substantially the entire length of the micro-channel, but will only change physical states, and thus act as a micro-valve, in region 18 that is directly above heating element 15. As mentioned above, type of valve consisting solely or primarily of a phase reversible material, e.g. gel, may be engineered to be a pure on/off valve, in which the fluid flow through the region of the microvalve can be completely inhibited by the valve, or a proportional valve, in which the flow of fluid through the valve can be selectively restricted as desired, without complete inhibition of fluid flow through the valve, i.e. a valve that can be manipulated to allow faster or slower fluid flow, as desired. In either case, the microvalve modulates fluid flow along the flow path. For the proportional valve, the phase reversible material from which the micro-valve is made will be one to which a stimulus ramp may be applied, i.e. a stimulus that changes (e.g. increases or decreases) in magnitude over a give period of time. For example, a thermoreversible material may be employed that responds to a thermal ramp in a manner such that the properties of the material gradually change along the thermal ramp, e.g. the pores in the gel matrix gradually decrease in size along the thermal ramp.

Figure 2:
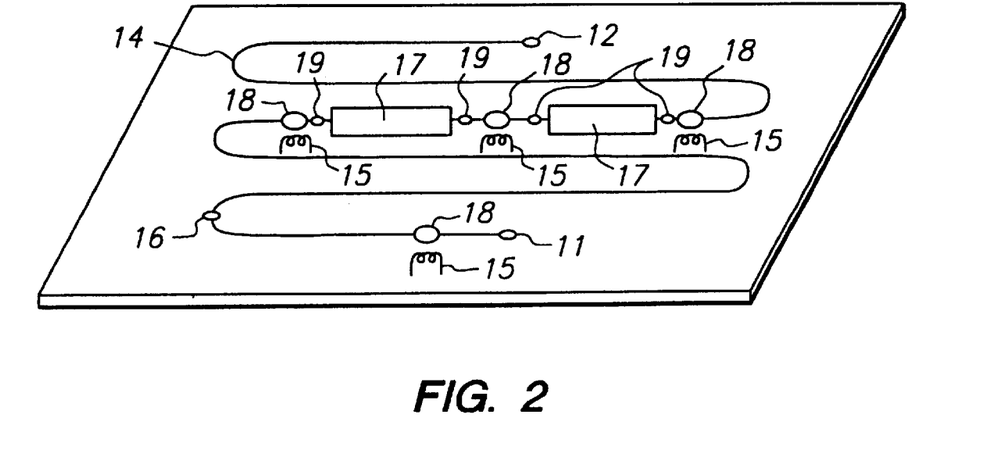
FIG. 2 provides a representation of a variation of the device shown in FIG. 1.

FIG. 2 provides a representation of a variation on the device shown in FIG. 1. In FIG. 2, the device shown in FIG. 1 further comprises micro-chambers 17 positioned along the flow path and separated by micro-valves 18. On either side of micro-chambers 17 are ports 19. As such, fluid flow into and out of the micro-chambers may be controlled through the plurality of micro-valves in the device.

Figure 3:
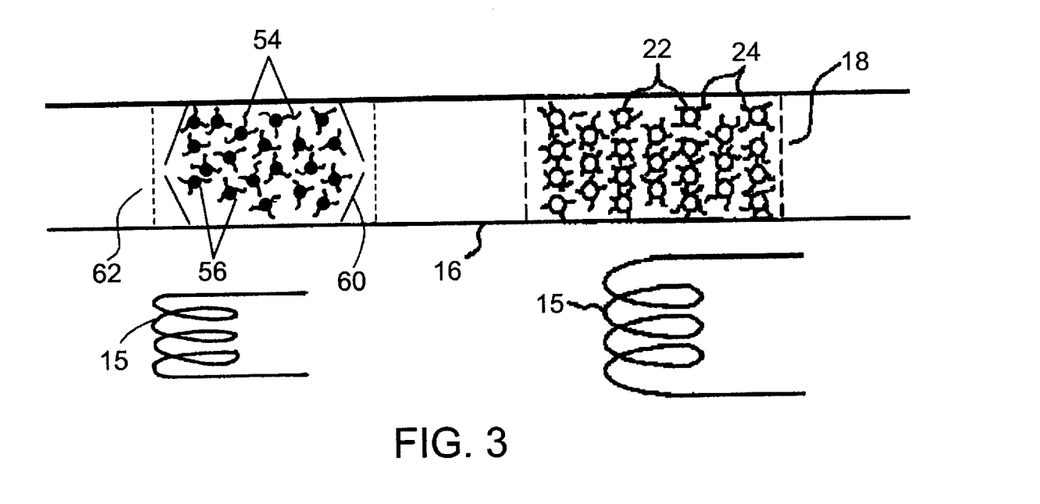
FIG. 3 provides a representation of a micro-valve according to one embodiment of the subject invention.

Instead of having a micro-valve that consists of essentially of the reversible gel, the valve may further comprise one or more additional mechanical elements of high surface area, as described above. FIG. 3 shows two representative valves of this embodiment of the invention. In FIG. 3, an enlarged view of the element 18 of FIG. 1 is provided. In FIG. 3, micro-channel 16 comprises micro-valve 18 positioned directly above heating element 15. Micro-valve 18 comprises a plurality or array of pins 22 arising from the floor of the micro-channel. The inter-post spacing of the array may vary between about 0.01 $\mu$m and 50 $\mu$m, but in many embodiments the distance between any two given posts in the array does not exceed about 1.75 $\mu$m, and usually does not exceed about 1.25 $\mu$m, where in many embodiments this distance is about 1.0 $\mu$m. Directly attached to the rod or pin surface are the polymeric constituents 24 of the gel matrix of the micro-valve. The polymeric constituents are able to interact with each other such that under a first condition (at a first temperature) they are free moving with respect to each other, e.g., soluble, such that fluid is able to flow freely through the array, but in a second condition that are closely associated with each other, such the fluid flows less freely and/or not at all, through the array. Thus, this embodiment of the subject invention can be used to produce both on/off and proportional micro-valves along a given micro-channel, as with the first embodiment. FIG. 3 also shows micro-valve 62, another version of element 18 of FIG. 1, which is also positioned directly above heating element 15. Micro-valve 62 comprises a plurality of mobile or detached high surface area components 56, for example beads. Directly attached to the mobile or detached high surface area components 56 are the polymeric constituents 24 of the gel matrix of the micro-valve. The plurality of mobile or detached high surface area components 56 are retained in the micro-valve by a retaining means 60, e.g., frits.

Figure 4:
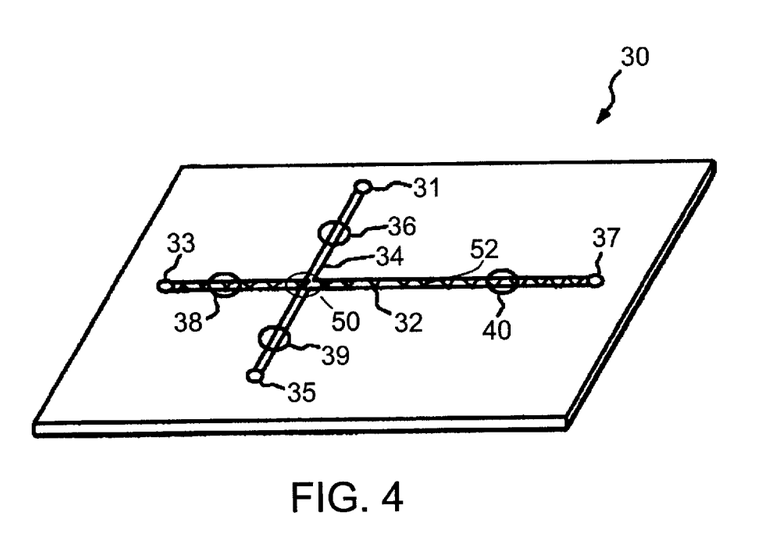
FIG. 4 provides a representation of yet another micro-fluidic device embodiment of the subject invention.
Figure 5:
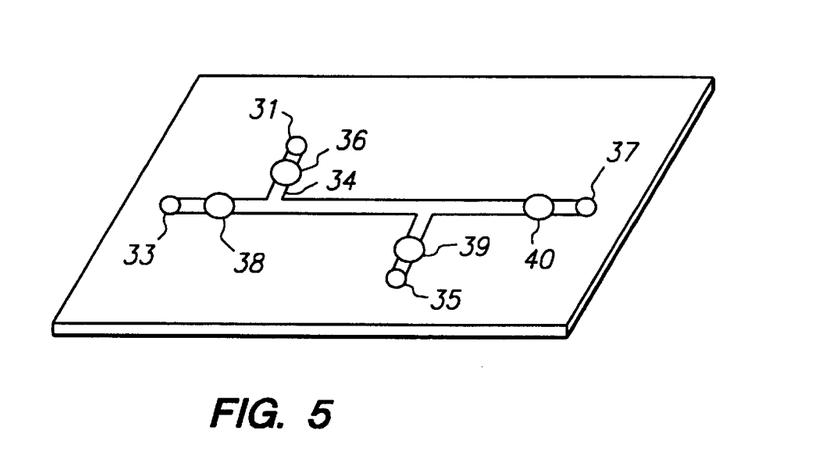
FIG. 5 provides a representation of a variation on the device shown in FIG. 4.

Yet another embodiment of the subject invention is depicted in FIG. 4. In FIG. 4, device 30 comprise two intersecting micro-channels, 32 and 34, having entry ports 31 & 33 and exit ports 35 and 37. Micro-valves 36, 38, 39, 40 and 50 positioned along the micro-channels are used to control sample introduction into the flow channels. In this particular embodiment, one of the intersecting flow paths is substantially filled with a phase reversible material 52. FIG. 5 provides a representation of a variation of the device shown in FIG. 4.

The subject devices can be used in a variety of different fluid flow processes, (i.e. applications in which fluid flow is manipulated (fluid flow manipulation applications)) including sample preparation, separation, and chemical synthesis applications. Representative applications in which the subject devices find use are described in U.S. Pat. Nos. 5,770,029; 5,755,942; 5,746,901; 5,681,751; 5,658,413; 5,653,939; 5,653,859; 5,645,702; 5,605,662; 5,571,410; 5,543,838; 5,480,614; the disclosures of which are herein incorporated by reference. In using the subject devices, fluid flow through the micro-channel(s) of the device will be modulated by selectively manipulating the micro-valve(s) present in the device, e.g. by locally raising the temperature of the gel in the micro-valve, etc. Typically, the subject devices will be used in conjunction with one or more additional devices, such as a detector device, a sample introduction device, etc., where such devices and their use are known to those of skill in the art.

Also provided are kits comprising the subject microfluidic devices. The subject kits comprise at least one micro-fluidic device according to the subject invention. The kits may further include a phase reversing means or components thereof, e.g. a heating means. The kits of the subject invention will also typically include instructions for using the subject device, including instructions for operating the micro-valve(s) present in the device, where these instructions may be present on one or more of the packaging, labeling or a package insert. In addition, the kits may comprise one or more additional elements that find use in the particular application for which the device has been fabricated, such as: elements used in electrophoretic or chromatographic applications, such as a separation medium, labels for use in separation, buffer mediums, and other reagents for practicing electrochromatographic protocols; etc.

The following examples are offered by way of illustration and not by way of limitation.

EXPERIMENTAL

I. Synthesis and Testing of Micro-Valve.

A1. Synthesis of a Temperature-Sensitive Polymer.

Isopropylacrylamide (IPAAm, 5.6 g, 50 mmol) in 20 ml of DMF was combined with 75 $\mu$l (0.5 mmol) of butyl methacrylate (BMA) and 10–20 $\mu$l (0.05 mmol) of ethylene glycol dimethacrylate. This solution was passed through a column of "inhibitor-remover" packing (Aldrich #31.133-2) then degassed for 15 minutes with a stream of helium gas. The degassed solution was treated with 2,2'-dimethyl azo-bisisobutyrate and heated under argon at 80° C. for 24 hr. Solvent was evaporated, leaving the temperature-sensitive polymer.

A2. Synthesis of Gel Micro-Valve on Glass Substrate.

A glass substrate was silated with 3-aminopropyl silane to generate free amino groups on the surface of the substrate. This surface was covered with a solution of 50 mg of sulfo-HSAB (N-hydroxysulfosuccinimidyl-4-azido benzoate) dissolved in 5 ml of phosphate buffer (pH 8.5). The substrate was allowed to sit in the dark for 3 hr, then rinsed with water and air-dried.

Approximately 1 g of the temperature-sensitive polymer was dissolved in 10 ml of water. This solution was placed over the azido-activated glass substrate and exposed to UV light at 265 nm for ca. 30 min from a distance of 3–6 cm. The glass substrate was then rinsed with water and air-dried.

A3. Synthesis of Gel Micro-Valve on Polyimide Substrate.

The synthesis of a thermosensitive gel matrix covalently attached to a polyimide substrate proceeds as follows. The surface of the polyimide substrate is treated with a strong base, e.g. KOH or NaOH in the presence of HOAc, in order to open up the imide and produce free carboxy functionalities. Activated esters are then produced in conventional ways and can be reacted with amines such as $H_2NCH_2CH_2NH_2$ or $H_2NCH_2CH_2OH$. The products are then treated with methacryloyl isocyanate to produce an intermediate that can then be treated with IPAAm and BMA in the presence of AIBN/DMF to produce a thermosensitive polymer grafted onto the polyimide support surface.

Alternatively, a product with a free amino group can be treated in the dark with N-hydroxysulfosuccinimidyl-4-azido benzoate in phosphate buffer (pH 8.5) for 3 hrs. The substrate is rinsed with water and air-dried. An aqueous solution of a temperature-sensitive polymer is placed over the azido-activated polyimide substrate and exposed to UV light at 265 nm for ca. 30 minutes. The substrate is then rinsed with water and air-dried.

A4. Synthesis of Micro-Valve on Nylon Substrate.

Nylon mesh filters (Spectrum #148130) with 5 μm opening were treated with a solution of 3.72 g of calcium chloride and 3.72 g of water in 20 ml methanol for 20 min at 50° C. The filter was then placed into 20 ml of 3.6 M HCl for 40 min at 45° C. Finally, the substrate was left in water for 20 hr.

This nylon substrate was covered with a solution of 50 mg of sulfo-HSAB dissolved in 5 ml of phosphate buffer (pH 8.5). The substrate was left in the dark at room temperature overnight, then rinsed with water and air-dried.

Approximately 1 g of the temperature-sensitive polymer was dissolved in 10 ml of water. This solution was placed over the azido-activated nylon substrate and exposed to UV light at 265 nm for ca. 30 min from a distance of 3–6 cm. The nylon substrate was then rinsed with water and air-dried.

B. Flow Profile through the Micro-Valve.

Figure 6:
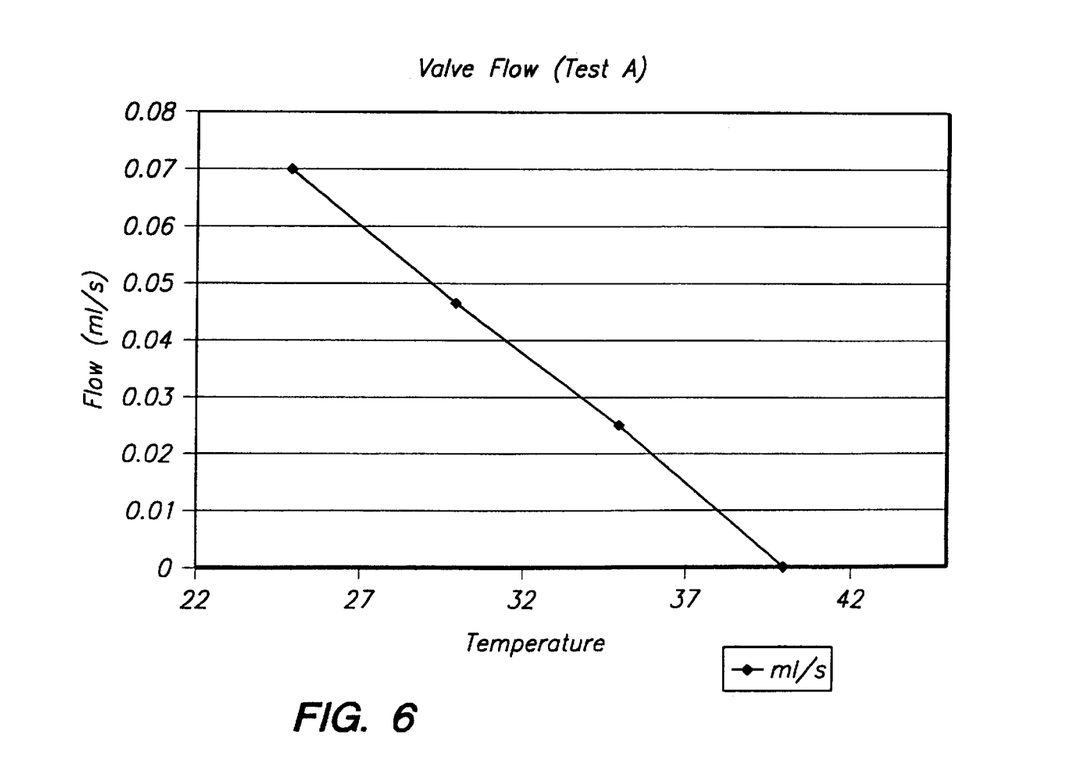
FIG. 6 provides a graph of the flow profile achieved through a micro-valve according to the subject invention.
Figure 7:
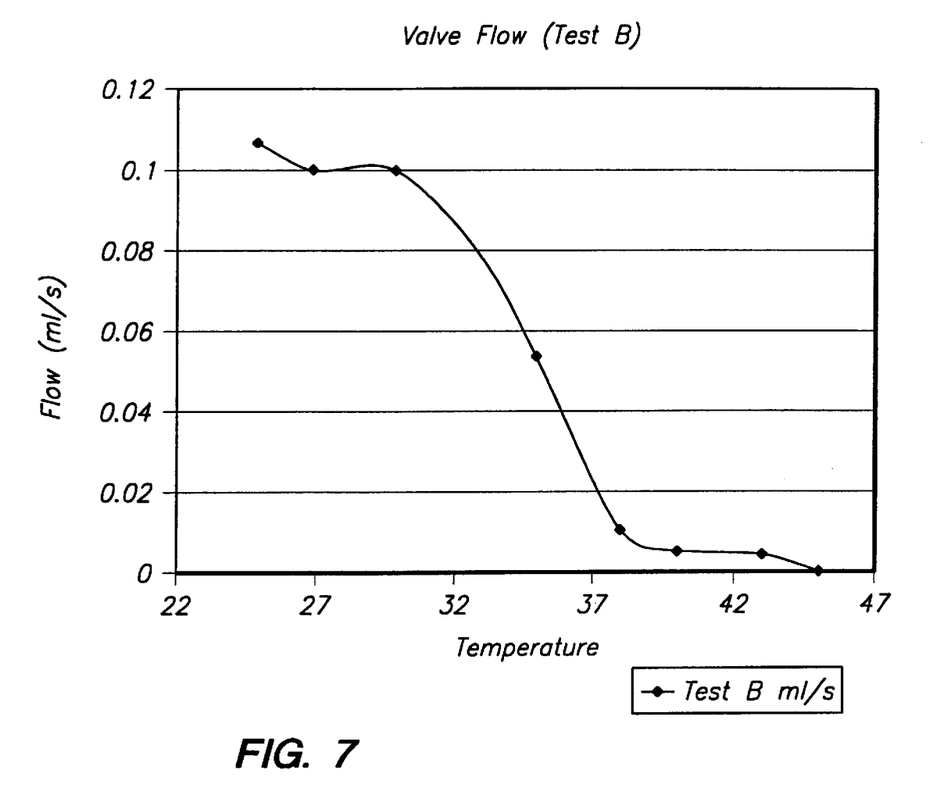
FIG. 7 provides a graph of the flow profile achieved through a second micro-valve according to the subject invention.

Two different polymer-modified nylon substrates (valve #1 and valve #2) were prepared as described in A4. The polymer-modified nylon substrate or valve was placed into a high pressure semi-prep filter assembly (Upchurch Scientific #A330) fitted with 2 capillary lines (in and out). The assembly was fitted into a drilled hole within an aluminum block. The block was controlled by a Peltier device and heat sink. The device allowed warming and cooling of the block and the filter assembly to within 1° C. accuracy. Fluids flowed through the nylon substrate (valve) and filter assembly via gravity feed. Examples of the type of fluids tested were: water, typical biological buffers, e.g., 100 mM phosphate or borate, or aqueous solutions containing up to 40% miscible organics, e.g., methanol or acetonitrile. The flow (volume/sec) was measured as a function of temperature. FIG. 6 shows the results from Valve #1 while FIG. 7 shows the results from Valve #2, where the results were obtained using de-ionized water as the fluid.

It is evident from the above results and discussion that the subject micro-valves provide for significant improvements over previously employed devices for controlling fluid flow through micro-fluidic devices. The subject micro-valves provide for a relatively simple and readily producible means for controlling the flow of fluid through micro-fluidic devices.

All publications and patent applications cited in this specification are herein incorporated by reference as if each individual publication or patent application were specifically and individually indicated to be incorporated by reference. The citation of any publication is for its disclosure prior to the filing date and should not be construed as an admission that the present invention is not entitled to antedate such publication by virtue of prior invention.

Although the foregoing invention has been described in some detail by way of illustration and example for purposes of clarity of understanding, it is readily apparent to those of ordinary skill in the art in light of the teachings of this invention that certain changes and modifications may be made thereto without departing from the scope of the appended claims.

What is claimed is:

1. A micro-fluidic device having a fluid flow path and at least one micro-valve comprising a phase reversible material stably associated with said micro-valve, wherein said phase reversible material goes from a first permeable state to a second impermeable state.

2. The micro-fluidic device according to claim 1, wherein said device comprises two intersecting flow paths, wherein one of said flow paths is substantially filled with said phase reversible material and said micro-valve is positioned at the intersection of said intersecting flow paths.

3. The micro-fluidic device according to claim 1, wherein said micro-valve comprises said phase reversible material stably associated with a high surface area component.

4. The micro-fluidic device according to claim 3, wherein said high surface area component is stably associated with at least one wall of said fluid flow path.

5. The micro-fluidic device according to claim 3, wherein said high surface area component is maintained in said flow path by a retaining means.

6. The micro-fluidic device according to claim 1, wherein said phase reversible material is a phase reversible polymer.

7. The micro-fluidic device according to claim 1, wherein said phase reversible material is thermo-reversible.

8. A micro-fluidic device comprising a micro-valve and two intersecting flow paths, wherein one of said intersecting flow paths is substantially filled with a phase reversible material stably associated with said micro-valve and said phase reversible material goes from a first permeable state to a second impermeable state, wherein said micro-valve is positioned at the intersection of said intersecting flow paths.

9. The micro-fluidic device according to claim 8, wherein said micro-fluidic device comprises at least one micro-compartment.

10. The micro-fluidic device according to claim 9, wherein said micro-compartment is a micro-channel.

11. The micro-fluidic device according to claim 8, wherein said phase reversible material is a phase reversible polymer.

12. The micro-fluidic device according to claim 11, wherein said phase reversible polymer is an N-isopropylacrylamide copolymer.

13. The micro-fluidic device according to claim 11, wherein said phase reversible polymer is a polyalkylene oxide.

14. The micro-fluidic device according to claim 8, wherein said phase reversible material is thermo-reversible.

15. A micro-fluidic device comprising a fluid flow path and at least one micro-valve, wherein said micro-valve comprises a phase reversible material stably associated with a high surface area component, and wherein said high surface area component is stably associated with at least one surface of said flow path, and said phase reversible material goes from a first permeable state to a second impermeable state.

16. The micro-fluidic device according to claim 15, wherein said high surface area component comprises an array of posts bonded to said at least one surface of said flow path.

17. The micro-fluidic device according to claim 15, wherein said micro-fluidic device comprises at least one micro-compartment.

18. The micro-fluidic device according to claim 17, wherein said micro-compartment is a micro-channel.

19. The micro-fluidic device according to claim 15, wherein said phase reversible material is a phase reversible polymer.

20. The micro-fluidic device according to claim 19, wherein said phase reversible polymer is an N-isopropylacrylamide copolymer.

21. The micro-fluidic device according to claim 19, wherein said phase reversible polymer is a polyalkylene oxide.

22. The micro-fluidic device according to claim 15, wherein said phase reversible material is thermo-reversible.

23. A micro-fluidic device comprising a fluid flow path and at least one micro-valve, wherein said micro-valve comprises a phase reversible material stably associated with a high surface area component maintained in said flow path by a retaining means, wherein said phase reversible material goes from a first permeable state to a second impermeable state.

24. The micro-fluidic device according to claim 23, wherein said retaining means comprises fluid permeable barriers positioned in said flow path on opposite sides of said high surface area component.

25. The micro-fluidic device according to claim 22, wherein said retaining means comprises constrictions in said flow path present on either side of said high surface area component.

26. The micro-fluidic device according to claim 23, wherein said high surface area component is selected from the group consisting of: a plurality of solid phase particles; a membrane; and a mesh structure.

27. The micro-fluidic device according to claim 23, wherein said micro-fluidic device comprises at least one micro-compartment.

28. The micro-fluidic device according to claim 27, wherein said micro-compartment is a micro-channel.

29. The micro-fluidic device according to claim 23, wherein said phase reversible material is a phase reversible polymer.

30. The micro-fluidic device according to claim 29, wherein said phase reversible polymer is an N-isopropylacrylamide copolymer.

31. The micro-fluidic device according to claim 29, wherein said phase reversible polymer is a polyalkylene oxide.

32. The micro-fluidic device according to claim 23, wherein said phase reversible material is thermo-reversible.

* * * * *

UNITED STATES PATENT AND TRADEMARK OFFICE
CERTIFICATE OF CORRECTION

PATENT NO. : 6,375,901 B1
DATED : April 23, 2002
INVENTOR(S) : William R. Frank, Jonathan Dorricott, Laurie E. Collins, Joseph D. Russo, Robert J. Boecker and Brian H. Wales It is certified that error appears in the above-identified patent and that said Letters Patent is hereby corrected as shown below:

Column 5,
Line 65, "21" should be deleted.

Column 6,
Line 14, "group" should read -- quench --; and
Line 28, "into" should read -- the --.

Column 11,
Line 29, "used suction" should read -- used to suction --.

Column 18,
Line 22, "that" should read -- than --;
Line 23, "the" should read -- that --; and
Line 55, "date" should read -- data --.

Column 20,
Line 25, "speed" should read -- spaced --.

Signed and Sealed this

Twenty-fourth Day of September, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO.    : 6,375,901 B1
DATED         : April 23, 2002
INVENTOR(S)   : William R. Frank, Jonathan Dorricott, Laurie E. Collins, Joseph D. Russo, Robert J. Boecker and Brian H. Wales It is certified that error appears in the above-identified patent and that said Letters Patent is hereby corrected as shown below:

Column 5,
Line 65, "21" should be deleted.

Column 6,
Line 14, "group" should read -- quench --; and
Line 28, "into" should read -- the --.

Column 11,
Line 29, "used suction" should read -- used to suction --.

Column 18,
Line 22, "that" should read -- than --;
Line 23, "the" should read -- that --; and
Line 55, "date" should read -- data --.

Column 20,
Line 25, "speed" should read -- spaced --.

Signed and Sealed this

Twenty-ninth Day of October, 2002

*Attest:*

JAMES E. ROGAN
*Attesting Officer*         *Director of the United States Patent and Trademark Office*

UNITED STATES PATENT AND TRADEMARK OFFICE
CERTIFICATE OF CORRECTION

PATENT NO.     : 6,375,901 B1                                                    Page 1 of 1
DATED          : April 23, 2002
INVENTOR(S)    : William R. Frank, Jonathan Dorricott, Laurie E. Collins, Joseph D. Russo,
                 Robert J. Boecker and Brian H. Wales It is certified that error appears in the above-identified patent and that said Letters Patent is hereby corrected as shown below:

Column 5,
Line 65, "21" should be deleted.

Column 6,
Line 14, "group" should read -- quench --; and
Line 28, "into" should read -- the --.

Column 11,
Line 29, "used suction" should read -- used to suction --.

Column 18,
Line 22, "that" should read -- than --;
Line 23, "the" should read -- that --; and
Line 55, "date" should read -- data --.

Column 20,
Line 25, "speed" should read -- spaced --.

Signed and Sealed this

Seventeenth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO.     : 6,375,901 B1
DATED          : April 23, 2002
INVENTOR(S)    : Kalia M. Robotti et al.

It is certified that error appears in the above-identified patent and that said Letters Patent is hereby corrected as shown below:

This certificate supersedes Certificates of Correction issued September 24, 2002, October 29, 2002, and December 17, 2002 the number was erroneously mentioned and should be vacated since no Certificate of Correction was granted.

Signed and Sealed this

Twenty-first Day of January, 2003

JAMES E. ROGAN
*Director of the United States Patent and Trademark Office*